(12) United States Patent
Droz et al.

(10) Patent No.: US 9,304,154 B1
(45) Date of Patent: Apr. 5, 2016

(54) DYNAMIC MEASUREMENTS OF PULSE PEAK VALUE

(71) Applicants: Pierre-yves Droz, Mountain View, CA (US); Anthony Levandowski, Berkeley, CA (US)

(72) Inventors: Pierre-yves Droz, Mountain View, CA (US); Anthony Levandowski, Berkeley, CA (US)

(73) Assignee: Google Inc., Mountain View, CA (US)

( * ) Notice: Subject to any disclaimer, the term of this patent is extended or adjusted under 35 U.S.C. 154(b) by 259 days.

(21) Appl. No.: 13/784,329

(22) Filed: Mar. 4, 2013

(51) Int. Cl.
  *G01C 3/08* (2006.01)
  *G01R 25/00* (2006.01)
(52) U.S. Cl.
  CPC .................... *G01R 25/005* (2013.01)
(58) Field of Classification Search
  None
  See application file for complete search history.

(56) References Cited

U.S. PATENT DOCUMENTS

| | | | |
|---|---|---|---|
| 3,790,277 A | 2/1974 | Hogan | |
| 4,700,301 A | 10/1987 | Dyke | |
| 4,709,195 A | 11/1987 | Hellekson et al. | |
| 5,006,721 A | 4/1991 | Cameron et al. | |
| 5,202,742 A | 4/1993 | Frank et al. | |
| 5,367,162 A * | 11/1994 | Holland et al. | 250/287 |
| 5,982,214 A * | 11/1999 | Kim | 327/280 |
| 7,089,114 B1 | 8/2006 | Huang | |
| 7,187,452 B2 | 3/2007 | Jupp et al. | |
| 7,248,342 B1 | 7/2007 | Degnan | |
| 7,255,275 B2 | 8/2007 | Gurevich et al. | |
| 7,969,558 B2 | 6/2011 | Hall | |
| 2002/0000466 A1 * | 1/2002 | Lucera et al. | 235/462.01 |
| 2007/0183008 A1 * | 8/2007 | Kogure et al. | 359/3 |
| 2011/0141453 A1 | 6/2011 | Clement et al. | |
| 2012/0069321 A1 * | 3/2012 | Quilligan et al. | 356/5.01 |
| 2012/0170024 A1 | 7/2012 | Azzazy et al. | |
| 2012/0170029 A1 | 7/2012 | Azzazy et al. | |
| 2012/0269304 A1 | 10/2012 | Ciacci et al. | |

OTHER PUBLICATIONS

"Time-to-Digital Converter". Wikipedia: The Free Encyclopedia. http://en.wikipedia.org/wiki/Time-to-digital_converter.*

(Continued)

*Primary Examiner* — Luke Ratcliffe
*Assistant Examiner* — Samantha K Abraham
(74) *Attorney, Agent, or Firm* — McDonnell Boehnen Hulbert & Berghoff LLP (57) ABSTRACT

Methods and systems are provided for detecting and measuring a peak value of a light pulse. One example method involves (i) receiving an analog signal comprising a pulse, (ii) differentiating the analog signal, using a differentiator, to provide a differentiated signal, (iii) detecting, using a comparator, a zero-crossing in the differentiated signal, (iv) delaying the analog signal by a delay amount, using a signal buffer, to provide a time-delayed analog signal, (v) in response to detecting the zero-crossing, causing a measurement of the time-delayed analog signal to be obtained, (vi) determining a measurement time associated with the measurement, and (vii) outputting the measurement and the measurement time. The methods and systems may be implemented for light detection and ranging (LIDAR) applications. In such applications, the measurement and measurement time may correspond to an object and a distance of the object, respectively, in an environment of a LIDAR device.

19 Claims, 5 Drawing Sheets

(56) References Cited

OTHER PUBLICATIONS

"Flip-flop". Wikipedia: The Free Encyclopedia. http://en.wikipedia.org/wiki/Flip-flop_(electronics).*

Ullrich et al., Echo Digitization and Waveform Analysis in Airborne and Terrestrial Laser Scanning, pp. 217-228; http://www.ifp.uni-stuttgart.de/publications/phowo11/220Ullrich.pdf.

* cited by examiner

DYNAMIC MEASUREMENTS OF PULSE PEAK VALUE

BACKGROUND

Unless otherwise indicated herein, the materials described in this section are not prior art to the claims in this application and are not admitted to be prior art by inclusion in this section.

Light distance and ranging (LIDAR) is an optical remote sensing technology that may be utilized to acquire information on a surrounding environment. The LIDAR device may use ultraviolet, visible, or infrared light to illuminate and acquire information on a variety of different types of objects, such as metallic and non-metallic items, geological formations, and even atmospheric elements. The acquired information may include distances and textures of objects in the surrounding environment.

In operation, a LIDAR device may be configured to illuminate the objects with light, detect light reflected from the objects, and determine information on the objects based on the reflected light. In such an implementation, a distance of an object may be determined based on a time between when a light pulse for illuminating the object is transmitted and when a corresponding reflected light pulse is received at the LIDAR device. Further, a reflective property (or texture) of the object may be determined based on an amplitude of the reflected light pulse.

SUMMARY

In one aspect, a method is provided. The method may involve receiving an analog signal comprising a pulse, differentiating the analog signal, using a differentiator, to provide a differentiated signal, detecting, using a comparator, a zero-crossing in the differentiated signal, delaying the analog signal by a delay amount, using a signal buffer, to provide a time-delayed analog signal, in response to detecting the zero-crossing, causing a measurement of the time-delayed analog signal to be obtained, determining a measurement time associated with the measurement, and outputting the measurement and the measurement time.

In another aspect, a device is provided. The device may include an input configured to receive an analog signal comprising a pulse, a differentiator configured to differentiate the analog signal to provide a differentiated signal, a comparator configured to detect a zero-crossing in the differentiated signal, a signal buffer configured to delay the analog signal by a delay amount to provide a time-delayed analog signal, an analog-to-digital converter (ADC) configured to obtain a measurement of the time-delayed analog signal based on the zero-crossing detected by the comparator, and a time-to-digital converter (TDC) configured to determine a measurement time associated with the measurement.

In a further aspect, a non-transitory computer-readable medium having instructions stored thereon is provided. The instructions may be executable by a computing device to cause the computing device to perform functions including receiving a measurement of an analog signal comprising a pulse. A first portion of the analog signal is differentiated, by a differentiator, to provide a differentiated signal. A zero-crossing in the differentiated signal is detected, by a comparator. A second portion of the analog signal is delayed, by a signal buffer, to provide a time-delayed analog signal. The measurement is a digital output from an analog-to-digital converter (ADC) that samples the time-delayed analog signal based on the zero-crossing detected by the comparator. The functions further include receiving a measurement time associated with the measurement.

These as well as other aspects, advantages, and alternatives, will become apparent to those of ordinary skill in the art by reading the following detailed description, with reference where appropriate to the accompanying drawings.

DETAILED DESCRIPTION

In the following detailed description, reference is made to the accompanying figures, which form a part thereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

A LIDAR device may be configured to illuminate an object in a surrounding environment with a light pulse, detect a corresponding light pulse reflected from the object, and determine information on the object based on the detection of the reflected light. The detection of the reflected light pulse may be implemented in different ways. In one example, the LIDAR device may be configured to measure a signal generated from the received reflected light pulse. For instance, the signal may be sampled by an analog-to-digital converter (ADC) to generate a digital signal representative of a magnitude of the pulse when sampled.

Figure 1A:
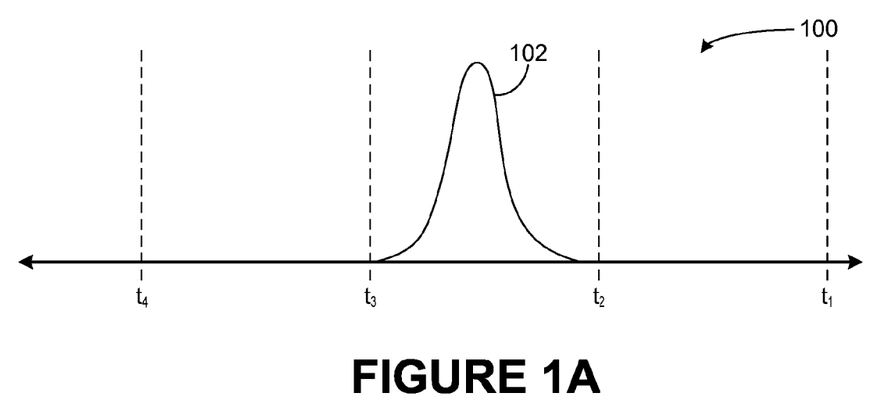
FIG. 1A shows a first example of light pulse sampling, in accordance with an example embodiment.

FIG. 1A shows a first example of light pulse sampling 100, in accordance with an example embodiment. The first example light pulse sampling 100 includes an analog input signal having a pulse 102, and times $t_1$, $t_2$, $t_3$, and $t_4$ when the input signal is sampled. In this example, the pulse 102 may be a part of the input signal representative of a reflected light pulse received at the LIDAR device from an object in a surrounding environment. For illustration purposes, the pulse 102 of FIG. 1A may have a Gaussian waveform. In operation, the pulse 102 may vary in pulse shape depending on at least a shape of the light pulse generated for illuminating the object.

In the first example light pulse sampling 100, sampling of the input signal may be configured to occur periodically at times $t_1$, $t_2$, $t_3$, $t_4$, and so on. As shown in FIG. 1A, however, the pulse 102 may be present between sampling times $t_2$ and $t_3$. As such, the pulse 102 may be received as part of the input signal, but not sampled. Accordingly, the presence of the pulse 102 might not be detected, and the LIDAR device may determine that the object in the surrounding environment is not present.

Figure 1B:
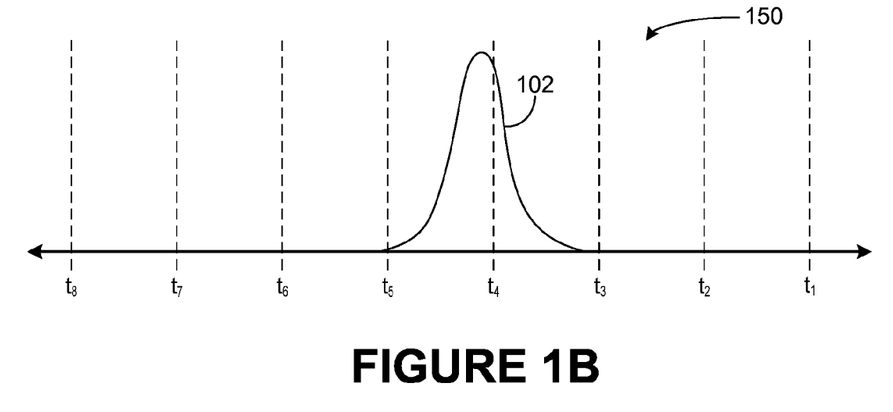
FIG. 1B shows a second example of light pulse sampling, in accordance with an example embodiment.

In such a case, the LIDAR device may have missed the pulse 102 because the sampling rate is too low. FIG. 1B shows a second example of light pulse sampling 150, in accordance with an example embodiment. As shown, the second example light pulse sampling 150 includes the input signal having the pulse 102, and sampling times $t_1$-$t_8$. In this example, the sampling rate may be higher than that of the first example light sampling 100, and as shown, may sample the pulse 102 at $t_4$. While the pulse 102 is sampled and detected in this illustrative example, due to an increased sampling rate, the sample taken at $t_4$ was not at a peak of the pulse 102.

In a LIDAR application, the magnitude of a detected light pulse may be indicative of a reflectivity and accordingly, a texture, or material of the object reflecting the light that is received. As such, while in this example, information from the sample taken at $t_4$ may be sufficient for roughly estimating a distance of the object, the information may not be sufficient for determining the texture or material of the object. Accordingly, the sampling rate of the LIDAR device may be further increased to improve a resolution of the information acquired based on the sampled data. For instance, an even higher sampling rate may result in sampling the pulse 102 at, or closer to the peak of the pulse 102, thereby providing a more accurate determination of what the object might be. In these cases, however, the costs of providing higher sampling, both in the form of monetary costs, such as that of faster, higher quality ADCs, and in the form of increased power consumption for the increased sampling rates, may become prohibitive and/or impractical.

Figure 2:
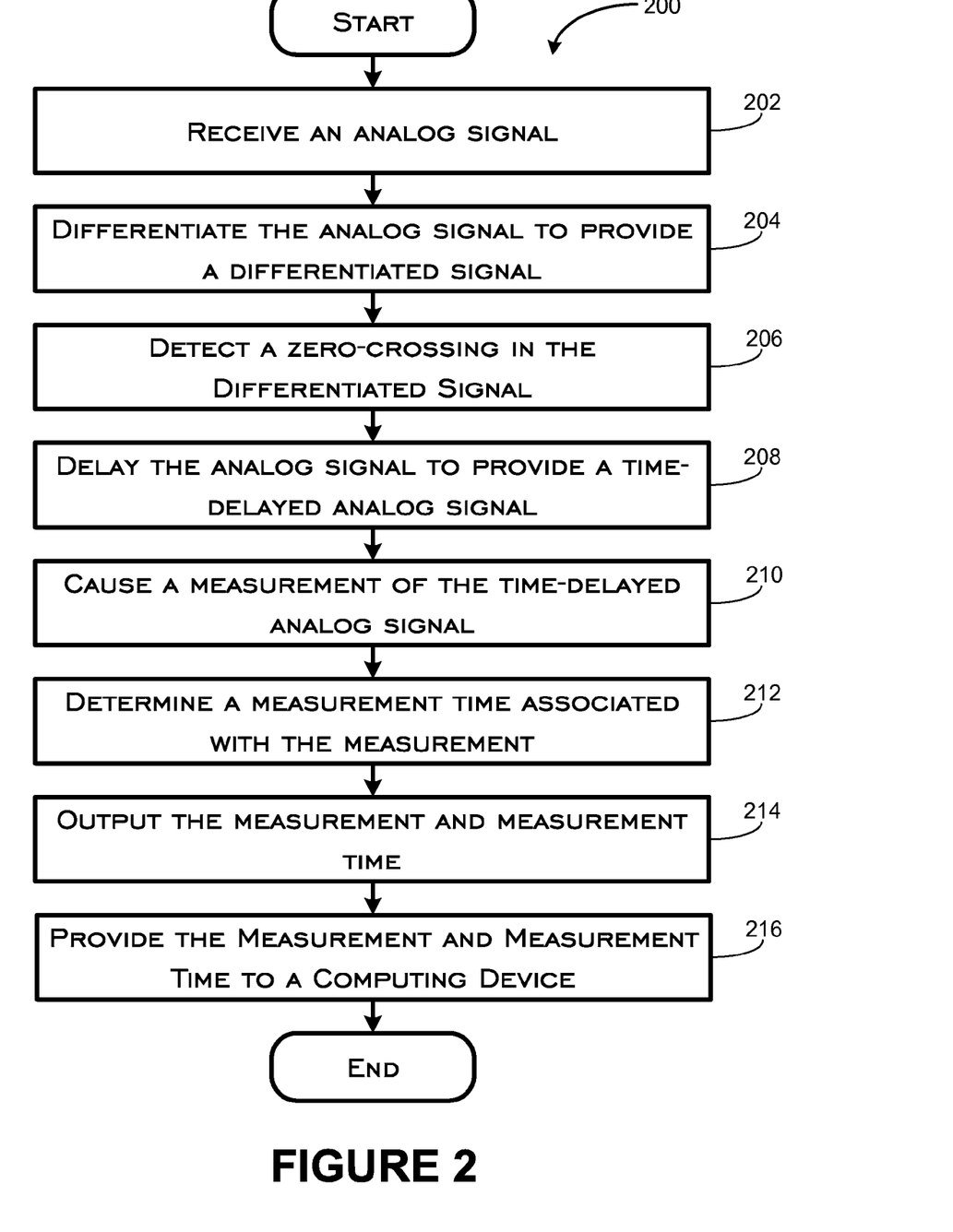
FIG. 2 is a flowchart depicting a method for detecting and measuring a light pulse, in accordance with an example embodiment.

An example method may detect a peak of the light pulse and measure the light pulse at the peak. FIG. 2 shows a flowchart depicting such an example method 200 for detecting and measuring a light pulse, in accordance with an example embodiment. Method 200 shown in FIG. 2 presents an embodiment of a method that could be implemented in a LIDAR device, and may be performed by a computing device or processor of the LIDAR device.

Method 200 may include one or more operations, functions, or actions as illustrated by one or more of blocks 202-216. Although the blocks are illustrated in a sequential order, these blocks may also be performed in parallel, and/or in a different order than those described herein. Also, the various blocks may be combined into fewer blocks, divided into additional blocks, and/or removed based upon the desired implementation. In addition, for the method 400 and other processes and methods disclosed herein, the flowchart shows functionality and operation of one possible implementation of present embodiments. In this regard, each block may represent a module, a segment, or a portion of program code, which includes one or more instructions executable by a processor or electronic circuit for implementing specific logical functions or steps in the process.

The program code may be stored on a storage medium, or any type of computer readable medium such as, for example, a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device.

Figure 3A:
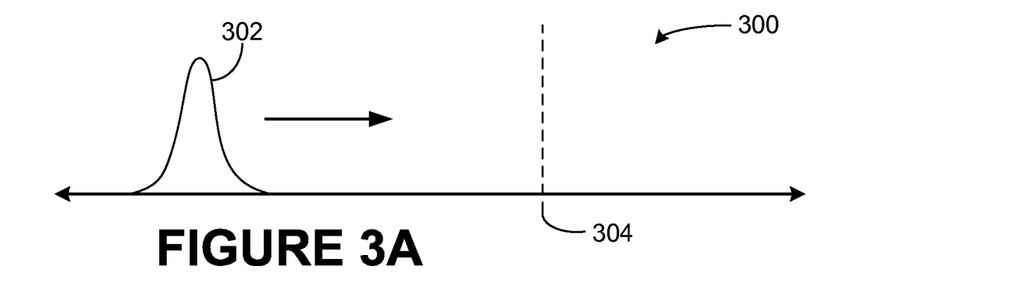
FIG. 3A shows a first instance of an example light detection, in accordance with an example embodiment.

At block 202, the method 200 may involve receiving an analog signal. In one example, the analog signal may be the input signal having a pulse, such as the pulse 102 of FIGS. 1A and 1B. Accordingly, the pulse may be a part of the analog input signal representative of a reflected light pulse received at a LIDAR device from an object in a surrounding environment. FIG. 3A shows a first instance 300 of an example light pulse detection, in accordance with an example embodiment. As shown, the first instance 300 includes a pulse 302 similar to that of pulse 102, traveling towards a reference position 304. In one case, the reference position 304 may correspond to where a photo-detector, such as a photodiode or photomultiplier is positioned in a LIDAR device for receiving light pulses reflected off of the object in the surrounding environment. In another case, the reference position 304 may correspond to when the pulse 302 is first received by a signal processor in the LIDAR device.

Rather than periodically sampling the analog signal to detect a received light pulse, as previously discussed, a peak of the pulse 302 may be detected, and the detection of the peak may be based upon to cause a measurement of the pulse 302 to be taken at the peak of the pulse 302. In other words, a measurement of the pulse 302 at the peak of the pulse 302 may be taken when the peak of the pulse 302 had been detected.

At block 204, the method 200 may involve differentiating the analog signal, using a differentiator, to provide a differentiated signal. Prior to the pulse 302 arriving at the reference position 304, the differentiated signal, absent any noise in the analog signal, may remain at zero. As the pulse 302 begins to arrive at the reference position 304, the differentiated signal may become positive as the pulse value at the reference position 304 increases.

Figure 3B:
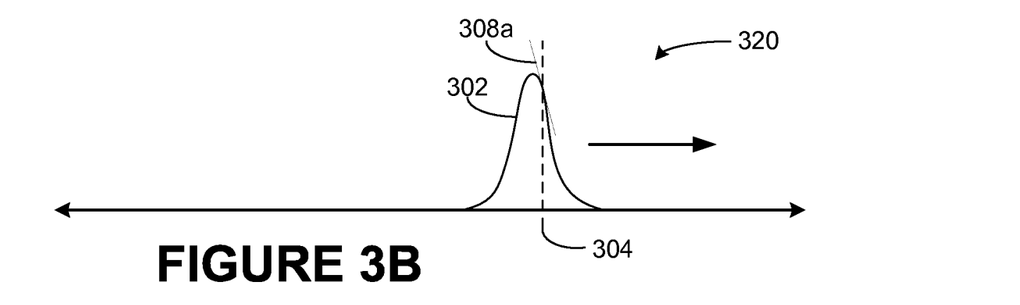
FIG. 3B shows a second instance of the example light pulse detection, in accordance with an example embodiment.
Figure 3C:
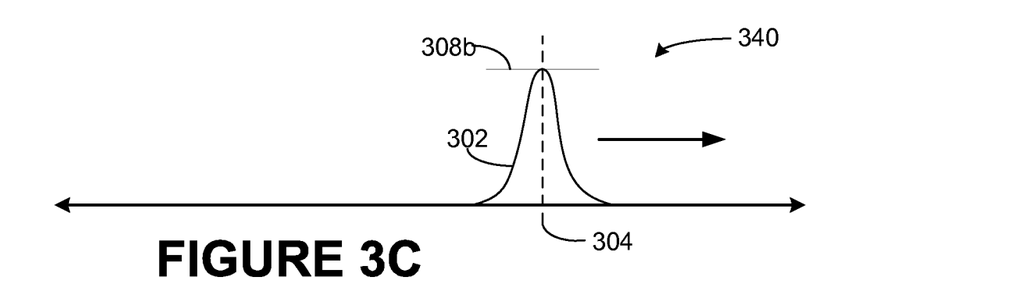
FIG. 3C shows a third instance of the example light pulse detection, in accordance with an example embodiment.
Figure 3D:
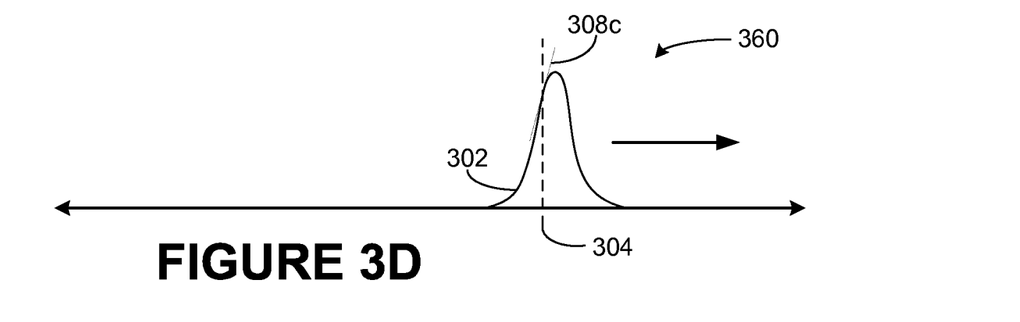
FIG. 3D shows a fourth instance of the example light pulse detection, in accordance with an example embodiment.

FIG. 3B shows a second instance 320 of the example light pulse detection, in accordance with an example embodiment. As shown, an illustrative first differentiated value 308a of the pulse 302 at reference position 304 is provided, indicating an upwards slope. FIG. 3C shows a third instance 340 of the example light pulse detection, in accordance with an example embodiment. As shown, an illustrative second differentiated value 308b of the pulse 302 at reference position 304 is provided, indicating no slope at the peak of the pulse 302 as the pulse 302 continues to travel through the reference position 304. FIG. 3D shows a fourth instance 360 of the example light pulse detection, in accordance with an example embodiment. As shown, upon the peak of the pulse 302 traveling pass the reference position 304, an illustrative third differentiated value 308c indicates a downward slope. As such, as the peak of the pulse 302 passes through the reference position 304, the differentiated signal changes from positive to negative, and is zero at the peak of the pulse 302.

In other words, the peak of the pulse 302 may be detected by detecting a zero-crossing in the differentiated signal. Accordingly, at block 206, the method 200 may involve detecting a zero-crossing in the differentiated signal. Detection of a zero-crossing in a signal may be implemented using a number of different electronic circuits. In one example, a comparator may be configured to detect the zero-crossing in the differentiated signal. For instance, the comparator may be configured to receive a changing signal, and provide an output of 1 ("on") if the signal is increasing or 0 ("off") if the signal is decreasing. In other words, the differentiated signal from the differentiator may be provided to the comparator, and an output from the comparator may be received indicating whether the differentiated signal is increasing or decreasing. As such, a zero-crossing in the differentiated signal may be detected when the output of the comparator switches. Particular to the present, a switch in the output of the comparator from on to off, indicating a zero-crossing in the differentiated signal from positive to negative, may be based upon to determine the presence of the peak in the pulse 302.

As indicated previously, a measurement of the pulse may be triggered in response to the detection of the peak of the pulse 302. In one example, a flip-flop (or latch) circuit configured to output an "on" signal when an input circuit to the flip-flop circuit transitions from on to off, and output an "off" signal otherwise may be provided. As such, the output of the comparator may be provided to the flip-flop circuit such that an output of the flip-flop circuit switches "on" when the output of the comparator transitions from on to off. In other words, the output of the flip-flop circuit switches on when the peak of the pulse 302 is detected. Accordingly, the output of the flip-flop circuit may be used to cause the analog signal to be measured.

As discussed, detection of the peak of the pulse 302 involves detecting a zero-crossing indicative of values of the pulse 302 at reference position 304 transitioning from increasing to decreasing. As such, by the time the peak of the pulse 302 has been detected, the peak of the pulse 302 has already travelled past the reference position 304. Further, the signal processing of the differentiator, comparator, and flip-flop circuit adds additional time between when the peak of the pulse 302 reaches the reference position 304 and when the output of the flip-flop circuit triggers a measurement of the analog signal.

In such a case, a delayed portion of the analog input signal may be generated and provided for measuring. At block 208, the method 200 may involve delaying the analog signal by a delay amount to provide a time-delayed analog signal. In one example, the analog input signal may be split such that a first portion of the split analog signal is provided for peak detection through the differentiator, comparator, and flip-flop circuit discussed above, and a second portion of the split analog signal may be delayed and provided for measurement. In other words, the first portion of the analog signal received by the LIDAR device may be directed to the differentiator of the LIDAR device, while the second portion of the analog signal may be directed to a signal buffer, for example, to provide a time-delayed analog signal.

In one example, the delay amount by which the analog signal is delayed may depend on operating times of the differentiator, the comparator, and the flip-flop circuit. In some cases the delay amount may further take into account other hardware and/or operational delays within the LIDAR device. Ultimately, the goal of the delay amount is such that a point in the time-delayed analog signal corresponds to an output of the flip-flop circuit resulting from the same point in the original analog signal. In one instance, the delay amount may be determined during a research and design stage of the LIDAR device based on specifications of the differentiator, the comparator, and the flip-flop circuits used in the device. In another instance, the delay amount may be further calibrated for the LIDAR device during manufacturing to account for variations in the circuit components. In an illustrative example, the delay amount may be in the range of 3 to 4 nanoseconds.

At block 210, the method 200 may involve causing a measurement of the time-delayed analog signal to be obtained. As indicated above in connection to block 206, the measurement of the time-delayed analog signal may be in response to a detection of the peak of the pulse in the analog signal. As such, a measurement may be made at a peak of a pulse in the time-delayed signal corresponding to the detected peak of the pulse in the analog signal. In one example, an ADC may be configured to receive the time-delayed analog signal, receive outputs from the flip-flop circuit, and sample the time-delayed analog signal in response to outputs of the flip-flop circuit. As indicated previously, the ADC may be configured to sample the time-delayed analog signal when the output of the flip-flop circuit is "on." Upon sampling the time-delayed analog signal, the ADC may provide a digital output corresponding to a measurement of the time-delayed analog signal. For instance, the ADC may provide a digital output representative of a magnitude or peak value of the pulse.

As discussed previously in reference to LIDAR devices, a distance of an object may be determined based on a time between when a light pulse for illuminating the object is generated and when a corresponding reflected light pulse is detected at the LIDAR device. As such, a time associated with a detected light pulse may be measured to determine a distance of the object reflecting the detected light pulse. Accordingly, at block 212, the method 200 may involve determining a measurement time associated with the measurement of the time-delayed analog signal in response to the "on" output of the flip-flop circuit.

In one example, the measurement time may be determined by a time-to-digital converter (TDC). In one case, the TDC may also receive outputs from the flip-flop circuit, and accordingly, may provide an output corresponding to the measurement time in response to the "on" output of the flip-flop circuit. As such, the measurement time from the TDC may correspond to when the peak of the pulse occurs in the analog signal, relative to a reference time. In one example, the reference time may be a time when a generated light pulse corresponding to the detected light pulse reflected from the object in the surrounding environment is provided by the LIDAR device. As such, the measurement time may be based upon to determine a distance of the object in the surrounding environment. In one case, the measurement time also may be adjusted to account for time delays due to the differentiator, the comparator, and the flip-flop circuit.

Upon determining the measurement of the time-delayed analog signal at block 210, and the measurement time associated with the measurement at block 212, information associated with the object in the surrounding environment may be determined. At block 214, the method 200 may involve outputting the measurement and the measurement time. At block 216, the measurement and the measurement time may be provided to a computing device within, or coupled to the LIDAR device for further processing to determine the information, such as the distance and/or texture of the object in the surrounding environment from which the detected light was reflected.

Figure 4:
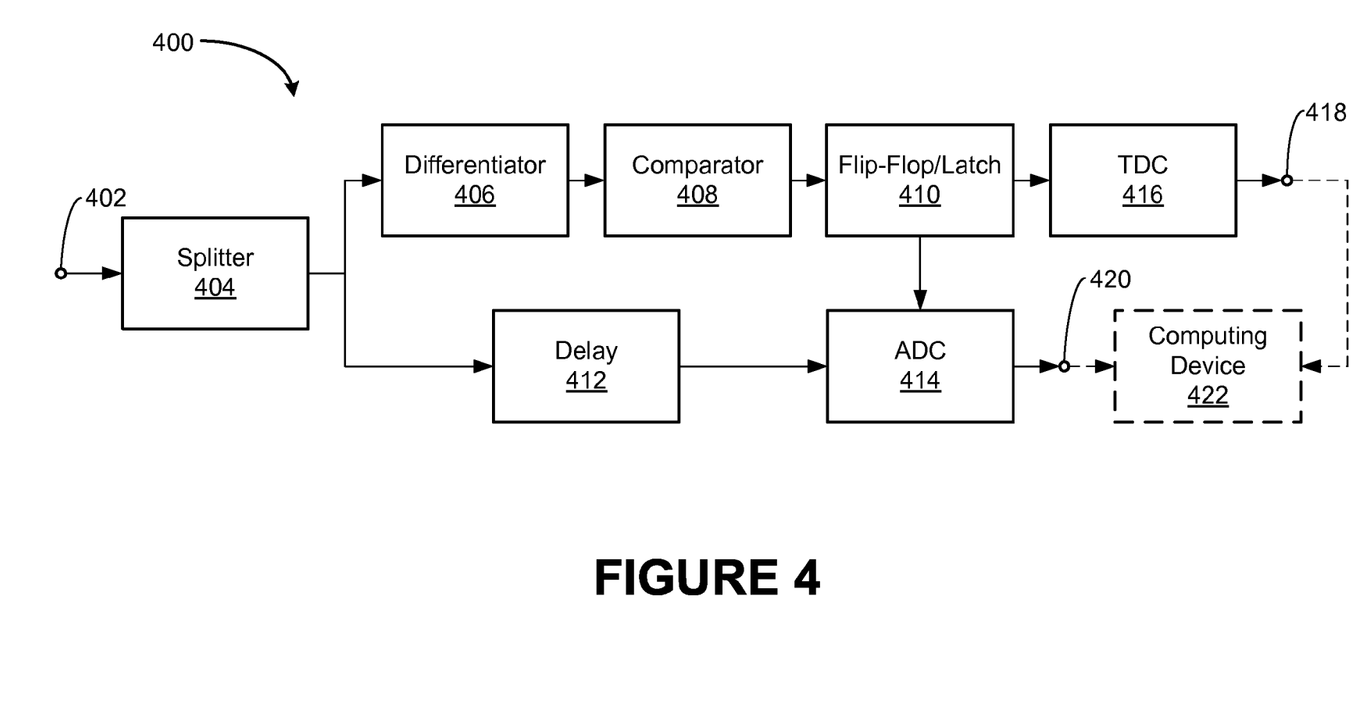
FIG. 4 is a block diagram of a pulse detection device, in accordance with an example embodiment.

FIG. 4 is a simplified flow diagram of a pulse detection device 400, in accordance with an example embodiment. The pulse detection device 400 may be a part of a LIDAR device and configured to perform the functions described above in connection to the method 200 of FIG. 2. In one example, the pulse detection device 400 may be coupled to and controlled by a computing device associated with the LIDAR device to perform the functions of method 200.

As shown, the light pulse detection device 400 includes an input 402, a signal splitter 404, a differentiator 406, a comparator 408, a flip-flop/latch 410, a TDC 416, a delay 412, an ADC 414, and digital outputs 418 and 420. In one example, the input 402 may be configured to receive an analog input signal representative of reflected light, as previously discussed. In this example, the input 402 may be coupled to the output of a photo-detector configured to receive the reflected light. In some cases, the input 402 may be coupled to the output of the photo-detector via a signal processor where the output of the photo-detector is filtered and amplified to provide to the input 402 a cleaner input signal with improved signal-to-noise ratio.

The signal splitter 404 is coupled to the input 402 and is configured to direct a first portion of the input signal to the differentiator 406 and a second portion of the input signal to the delay 412. The signal splitter 404 could be, for example, a passive circuit component, an active circuit component, or a combination of passive and active circuit components that can output two substantially identical portions of the analog signal received at input 402.

The differentiator 406 may then receive the first portion of the analog signal from the splitter 402 and accordingly provide a differentiated signal. In one example, the differentiator 406 may be a circuit including a high input impedance operational amplifier coupled to an input capacitor and a feedback resistor. In this example, the current flowing through the capacitor may be proportional to the derivative of the voltage across the capacitor, and a voltage output proportional to the derivative of the voltage may be generated from the current flowing through the feedback resistor. In another example, the differentiator 406 may be a passive RC circuit including a capacitor in series with the input and an output resistor. Other circuit designs for the differentiator 406 may also be possible.

The comparator 408 may then receive the differentiated signal from the differentiator 406 and provide an output indicating whether the differentiated signal is positive (input signal is increasing) or negative (input signal is decreasing). In one example, the comparator 408 may include an operational amplifier having one input coupled to ground and the other input coupled to the differentiator 406 to receive the differentiated signal. In operation, the comparator 408 may then provide an output of 1 ("on") if the differentiated signal is greater than 0, at ground, or 0 ("off") if the differentiated signal is less than 0. Accordingly, a transition from 1 to 0 or from 0 to 1 in the output of the comparator 408 may indicate a zero-crossing in the differentiated signal. Other circuit designs for the comparator 408 may also be possible.

The output of the comparator 408 may then be provided to the flip-flop/latch 410, which may be one of a number of different flip-flop or latch circuits, such as a set-and-reset latch, a gated latch, or a D flip-flop. In one example, the flip-flop/latch 410 may be configured to store a previous input (or state) and provide an output based both the previous input and a current input. As applicable to the pulse detection device 400, the flip-flop/latch 410 may be configured to provide a 1 ("on") output if consecutive inputs to the flip-flop/latch 410 transitioned from 1 to 0, and provide a 0 ("off") output otherwise. As such, the flip-flop/latch 410 may output a 1 when a zero-crossing, indicating a peak of a pulse in the analog input signal is detected. Other circuit configurations for the flip-flop/latch 410 may also be possible.

As discussed in connection to the method 200 and shown in FIG. 4, outputs from the flip-flop/latch 410 may be provided as inputs to both the TDC 416 and the ADC 414. In one example, the TDC 416 may be configured to provide a digital output 418 representing a time in response to outputs from the flip-flop/latch 410. In one case, the time may be a duration between a reference time and when an output of 1 is received from the flip-flop/latch 410. As applicable to a LIDAR device, the reference time may be a time when a generated light pulse corresponding to the detected light pulse reflected from the object in the surrounding environment is provided by the LIDAR device. The TDC 416 may include a high frequency counter that may be configured to begin incrementing when the generated light pulse is provided, and output the value of the counter as a time measurement when the output of 1 is received from the flip-flop/latch 410. In some cases, the TDC 416 may further include time interpolation capabilities to provide representations of time with added precision, if the frequency of the counter is insufficient. Other configurations for the TDC 416 may also be possible.

In addition to receiving the output from the flip-flop/latch 410, the ADC 414 as shown in FIG. 4 may also receive an output from the delay 412. As previously discussed, the delay 412 may be configured to provide a time-delayed version of the input analog signal such that a point in the time-delayed analog signal corresponds to an output of the flip-flop/latch 410 resulting from the same point in the original analog signal. As shown, the delay 412 may receive the second portion of the input analog signal from the input 402 and accordingly provide the time-delayed analog signal to the ADC 414. In one example, the delay 412 may include a series of signal buffers and/or inverters to create a time-delay between receiving the analog input signal and providing the now time-delayed analog signal. In another example, the delay 412 may involve circuitry to hold the analog input signal while a high frequency counter increments to a predetermined delay amount before outputting the time-delayed analog signal. Other configurations for the delay 412 may also be possible.

The ADC 414 may be configured to then take a measurement of the time-delayed analog signal in response to the output of 1 from the flip-flop/latch 410 and provide a digital output 420. Given that the delay 412 provides a time-delayed version of the input analog signal such that a point in the time-delayed analog signal corresponds to an output of the flip-flop/latch 410 resulting from the same point in the original analog signal, the measurement of the time-delayed analog signal will correspond to a magnitude or value at the peak of the detected pulse. In one example, the ADC 414 may include an array of comparators configured to sample the time-delayed analog signal and output an incremented, digital representation of the value of the time-delayed analog signal. Other implementations of the ADC 414 may also be possible.

As shown in FIG. 4, the output 418 corresponds to the time measurement output from the TDC 416 and the output 420 corresponds to the magnitude measurement of the pulse in the time-delayed analog signal from the ADC 414. The outputs 418 and 420 may then be provided to a computing device 422 for further processing to determine information on an object in the environment from which the detected pulse in the analog input signal was reflected. Computing device 422 may determine information such as a distance of the object from the LIDAR device based on the time measurement received from the TDC 416 (output 418), and information such as a texture or reflectance of the object may be determined based on the magnitude measurement of the pulse received from the ADC 414 (output 420).

While the examples discussed above in connection to method 200 shown in FIG. 2 and pulse detection device 400 shown in FIG. 4 provide some embodiments for dynamic measurements of pulse peak values, one having ordinary skill in the art will appreciate that variations of the discussed embodiments, within the scope of the present application are also possible.

Figure 5:
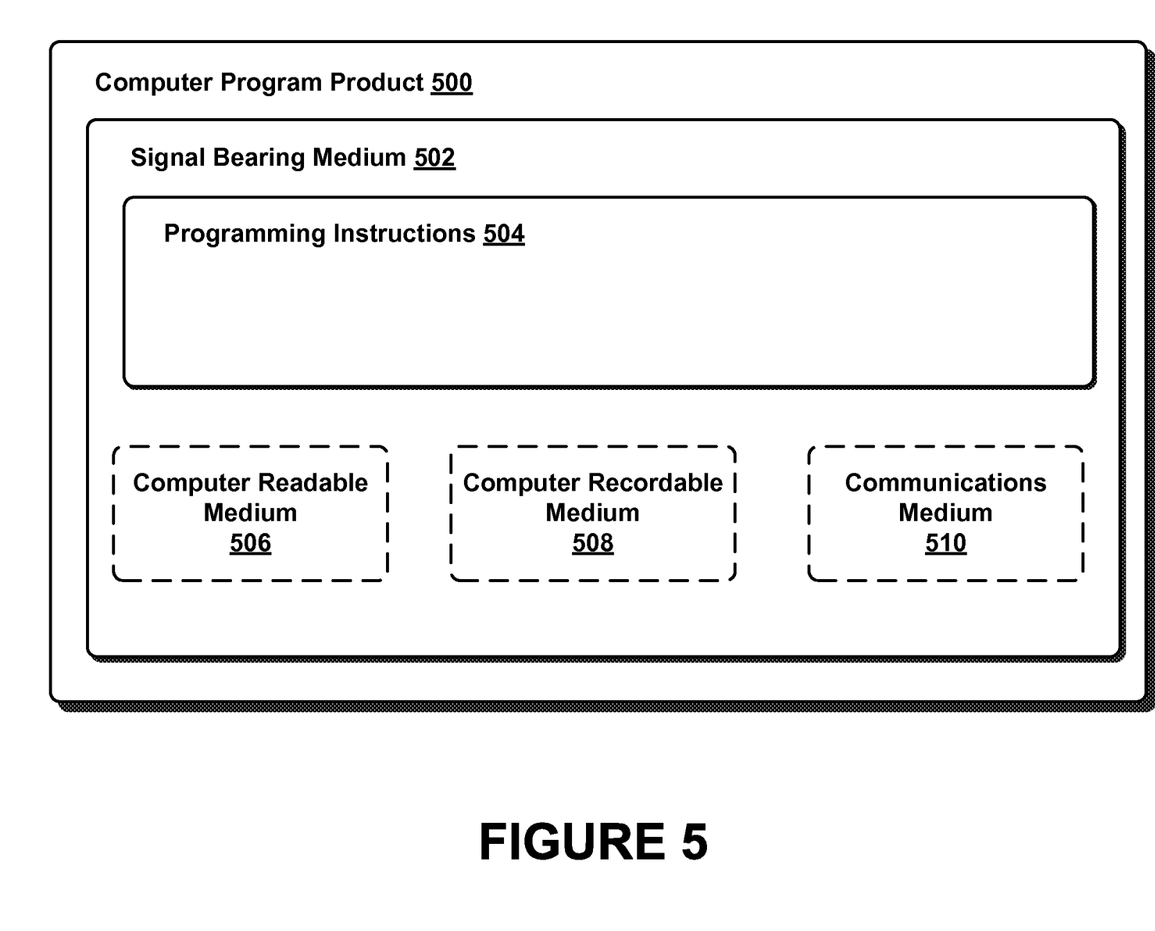
FIG. 5 is a computer-readable medium, in accordance with an example embodiment.

For example, a time associated with the measurement of the pulse peak value may not be needed. This may be the case when another component in the LIDAR device is configured to determine distances of objects in the surrounding environment. As such, block 212, and TDC 416 may be removed from method 200 and pulse detection device 400, respectively. Similarly, in another case, if another component in the LIDAR device is configured to determine the pulse peak value, block 210 and ADC 414 may be removed from method 200 and pulse detection device 400, respectively. In this case, the delay 412 may also be removed. Other variations are also be possible As indicated above, in some embodiments, the disclosed methods may be implemented by computer program instructions encoded on a non-transitory computer-readable storage media in a machine-readable format, or on other non-transitory media or articles of manufacture. FIG. 5 is a schematic illustrating a conceptual partial view of an example computer program product that includes a computer program for executing a computer process on a computing device, arranged according to at least some embodiments presented herein.

In one embodiment, the example computer program product 500 may be provided using a signal bearing medium 502. The signal bearing medium 502 may include one or more programming instructions 504 that, when executed by one or more processors may provide functionality or portions of the functionality described with respect to FIG. 2. In some examples, the signal bearing medium 502 may encompass a computer-readable medium 506, such as, but not limited to, a hard disk drive, a Compact Disc (CD), a Digital Video Disk (DVD), a digital tape, memory, etc. In some implementations, the signal bearing medium 502 may encompass a computer recordable medium 508, such as, but not limited to, memory, read/write (R/W) CDs, R/W DVDs, etc. In some implementations, the signal bearing medium 502 may encompass a communications medium 510, such as, but not limited to, a digital and/or an analog communication medium (e.g., a fiber optic cable, a waveguide, a wired communications link, a wireless communication link, etc.). Thus, for example, the signal bearing medium 502 may be conveyed by a wireless form of the communications medium 510.

The one or more programming instructions 504 may be, for example, computer executable and/or logic implemented instructions. In some examples, a processing unit such as one that may be a part of the light pulse detection device in FIG. 4 may be configured to provide various operations, functions, or actions in response to the programming instructions 504 conveyed to the processing unit by one or more of the computer readable medium 506, the computer recordable medium 508, and/or the communications medium 510.

The non-transitory computer readable medium could also be distributed among multiple data storage elements, which could be remotely located from each other. The computing device that executes some or all of the stored instructions could be a computing device such as any of those described above. Alternatively, the computing device that executes some or all of the stored instructions could be another computing device, such as a server.

While various aspects and embodiments have been disclosed herein, it should be understood that the embodiments are example embodiments and are described in connection to just some of many possible applications. Accordingly, it should also be understood that other aspects and embodiments are also possible. The various aspects and embodiments disclosed herein are for purposes of illustration and are not intended to be limiting, with the true scope and spirit being indicated by the following claims.

We claim:

1. A method comprising:
   receiving an analog signal comprising a pulse;
   directing a first portion of the analog signal to a differentiator and a second portion of the analog signal to a signal buffer;
   differentiating the first portion of the analog signal, using the differentiator, to provide a differentiated signal;
   detecting, using a comparator, a zero-crossing in the differentiated signal;
   delaying the second portion of the analog signal by a delay amount, using the signal buffer, to provide a time-delayed analog signal;
   in response to detecting the zero-crossing, causing a measurement of the time-delayed analog signal to be obtained;
   determining a measurement time associated with the measurement; and
   outputting the measurement and the measurement time.

2. The method of claim 1, wherein the delay amount corresponds to delay associated with the differentiator and the comparator.

3. The method of claim 2, wherein the delay amount is in the range of 3 to 4 nanoseconds.

4. The method of claim 1, wherein detecting, using a comparator, a zero-crossing in the differentiated signal comprises:
   providing the differentiated signal to the comparator; and
   receiving from the comparator an output indicating a transition from on to off.

5. The method of claim 4, wherein causing a measurement of the time-delayed analog signal to be obtained comprises:
   providing to a flip-flop circuit the output of the comparator indicating a transition from on to off; and
   receiving from the flip-flop circuit an output that causes an analog-to-digital converter (ADC) to sample the time-delayed analog signal and provide a digital output that corresponds to the measurement.

6. The method of claim 4, wherein determining a measurement time associated with the measurement comprises:
   providing to a flip-flop circuit the output of the comparator indicating a transition from on to off; and
   receiving from the flip-flop circuit an output that causes a time-to-digital converter (TDC) to provide an output that corresponds to the measurement time.

7. The method of claim 1, wherein the pulse in the analog signal is representative of a light pulse received by a light distance and ranging (LIDAR) device.

8. The method of claim 7, wherein the measurement corresponds to a peak value of the pulse, and wherein the measurement time corresponds to a time that the peak value occurs relative to a reference time.

9. A device comprising:
   an input, wherein the input is configured to receive an analog signal comprising a pulse;
   a differentiator, wherein the differentiator is configured to differentiate a first portion of the analog signal to provide a differentiated signal;
   a comparator, wherein the comparator is configured to detect a zero-crossing in the differentiated signal;
   a signal buffer, wherein the signal buffer is configured to delay a second portion of the analog signal by a delay amount to provide a time-delayed analog signal;

an analog-to-digital converter (ADC), wherein the ADC is configured to obtain a measurement of the time-delayed analog signal based on the zero-crossing detected by the comparator; and a time-to-digital converter (TDC), wherein the TDC is configured to determine a measurement time associated with the measurement.

10. The device of claim 9, further comprising a signal splitter coupled to the input, wherein the signal splitter is configured to direct the first portion of the analog signal to the differentiator and the second portion of the analog signal to the signal buffer.

11. The device of claim 9, wherein the delay amount corresponds to delay associated with the differentiator and the comparator.

12. The device of claim 9, wherein the comparator is configured to provide an output indicating a transition from on to off.

13. The device of claim 12, further comprising a flip-flop circuit, wherein the flip-flop circuit is configured to (i) receive the output of the comparator indicating a transition from on to off, and (ii) provide an output that causes the ADC to sample the time-delayed analog signal and provide a digital output that corresponds to the measurement.

14. The device of claim 12, further comprising a flip-flop circuit, wherein the flip-flop circuit is configured to (i) receive the output of the comparator indicating a transition from on to off, and (ii) provide an output that causes TDC to provide an output that corresponds to the measurement time.

15. A non-transitory computer readable medium having stored thereon instructions executable by a computing device to cause the computing device to perform functions comprising:

receiving a measurement of an analog signal comprising a pulse, wherein a first portion of the analog signal is differentiated, by a differentiator, to provide a differentiated signal and a zero-crossing in the differentiated signal is detected, by a comparator, and a second portion of the analog signal is delayed, by a signal buffer, to provide a time-delayed analog signal and the measurement is a digital output from an analog-to-digital converter (ADC) that samples the time-delayed analog signal based on the zero-crossing detected by the comparator; and receiving a measurement time associated with the measurement.

16. The computer readable medium of claim 15, wherein the delay amount corresponds to delay associated with the differentiator and the comparator.

17. The computer readable medium of claim 15, wherein the measurement time is a digital output from a time-to-digital converter (TDC).

18. The computer readable medium of claim 15, wherein the pulse in the analog signal is representative of a light pulse received by a light distance and ranging (LIDAR) device.

19. The computer readable medium of claim 18, wherein the measurement corresponds to a peak value of the pulse, and wherein the measurement time corresponds to a time that the peak value occurs relative to a reference time.

* * * * *